United States Patent
Chen et al.

(10) Patent No.: US 7,028,248 B2
(45) Date of Patent: Apr. 11, 2006

(54) MULTI-CYCLE SYMBOL LEVEL ERROR CORRECTION AND MEMORY SYSTEM

(75) Inventors: Chin-Long Chen, Fishkill, NY (US); William W. Shen, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 767 days.

(21) Appl. No.: 09/796,285

(22) Filed: Feb. 28, 2001

(65) Prior Publication Data
US 2002/0152444 A1 Oct. 17, 2002

(51) Int. Cl.
*H03H 13/00* (2006.01)

(52) U.S. Cl. ..................................................... 714/785

(58) Field of Classification Search ................ 714/737, 714/755–758, 765, 766–767, 785, 793
See application file for complete search history.

(56) References Cited

U.S. PATENT DOCUMENTS

| | | | | | |
|---|---|---|---|---|---|
| 3,703,705 | A | * | 11/1972 | Patel | 714/757 |
| 3,868,632 | A | * | 2/1975 | Hong et al. | 714/755 |
| 4,525,838 | A | * | 6/1985 | Patel | 714/755 |
| 4,555,784 | A | * | 11/1985 | Wood | 714/785 |
| 4,604,747 | A | * | 8/1986 | Onishi et al. | 714/755 |
| 5,600,659 | A | * | 2/1997 | Chen | 714/752 |

\* cited by examiner

*Primary Examiner*—Guy J. Lamarre
(74) *Attorney, Agent, or Firm*—Scully, Scott, Murphy & Presser; Lawrence D. Cutter

(57) ABSTRACT

Symbol level multi-cycle error correction and detection coding systems are developed and deployed in computer memory architectures resulting in an increase in robustness in terms of single bus line failures having no effect on the robustness of the coding technique and capabilities. The multi-cycle symbol level error correction techniques of the present invention also provide a mechanism for reducing the pin-out requirements for memory chips and dual in-line memory modules. The resulting ECC circuitry is thus simpler and consumes less real estate.

8 Claims, 5 Drawing Sheets

MULTI-CYCLE SYMBOL LEVEL ERROR CORRECTION AND MEMORY SYSTEM

BACKGROUND OF THE INVENTION

The present application is generally directed to error-correcting circuits and methods. More particularly, the present invention is directed to circuits and methods for use in computer memory systems. The present invention also includes computer memory systems incorporating multi-cycle symbol level error correction devices and processes as described herein.

As memory chips and systems have increase in capacity, the error correction and checking mechanisms employed have shifted from bit-oriented to symbol-oriented codes for improved granularity. However, the overhead in terms of circuit complexity for symbol level error correction systems is generally greater than that found in bit-oriented error correction systems. In order to reduce overhead, long error correction coding schemes are employed. However, a longer ECC (error correction code) codeword requires more input/output pins on the ECC chip that handles error correction and detection.

For example, consider an 8 bit per chip memory. If one wishes to employ a single symbol error detection and double symbol error detection (SSC-DSD) coding system, there is a requirement for 24 check bits for data lengths up to 2040 bits. The overhead for a data length of 64 bits would be $24/64=3/8$ and the number is reduced to $24/256=3/32$ for data length of 256 bits. However, using single symbol error detection and double symbol error detection codewords having a codeword length of 280 bits with 256 information bits and 24 redundant check bits requires an ECC chip which is able to receive 280 bits. This imposes significant demands on I/O pin requirements relating to getting information onto and out of a memory chip or its corresponding ECC chip.

SUMMARY OF THE INVENTION

In accordance with a preferred embodiment of the present invention, a symbol level error correction code is implemented using multiple cycles. In a multi-cycle implementation, stored codewords are read from or supplied to a memory system in more than one step (or cycle). In preferred embodiments of the present invention, a two-cycle implementation is employed and, accordingly, the I/O pin requirements are therefore reduced by a factor of one half. In general, using multi-cycle techniques, as described herein, the number of I/O pins in general is inversely proportional to the number of cycles used in the ECC operations. Accordingly, it is seen that the present invention is extendible to any number of desired cycles.

Just as importantly for the purposes of the present invention, the error correction coding technique employed herein is based on symbol level coding architectures. In symbol level coding systems, codewords are divided up into smaller chunks of bits which are processed together. In a particularly useful example described herein, each symbol includes four bits. However, the number of bits per symbol may be any convenient number. The symbol level organization of the memory and error correction systems of the present invention are also particularly important in preserving robustness of memory operations. In particular, the processing of symbols in accordance with the present invention is carried out in such a way and with such a memory architecture that precludes single bus line failures from interfering with the error correction capabilities of the overall system.

The present invention is based upon the utilization of so-called Reed-Solomon error correction codes in which a parity check matrix is an array of powers of a companion matrix T of a primitive polynomial p(x) of degree m. In codes as described herein, each codeword includes n symbols of which there are r symbols which are in fact redundant checkbit symbols. Thus, codes employed in the present invention have nm bits and rm checkbits.

However, it is noted that the coding techniques of the present invention are structured around multi-cycle operations. As such, the syndrome generators normally employed in error correction coding techniques are simpler and are somewhat different in structure than are typically employed in error correction systems. In particular, in preferred embodiments of the present invention, an apparatus for a syndrome generation includes an intermediate syndrome generator which receives selected blocks of codeword data with each block having nu bits, where m described above is the product of two integers u and w. The intermediate syndrome generator thus generates an intermediate syndrome vector which is supplied to a modulo 2 adder. The other input to this adder is initially zero, but thereafter, this input is supplied from an output register which receives the modulo 2 sum from the adder. The present invention, in accordance with the theory of multi-cycle operation presented below, also includes the utilization of an auxiliary syndrome generator which has as its input the contents of the output register which is used for temporary storage. The output of the auxiliary syndrome generator is supplied in w sequential cycles as input to the modulo 2 adder. The intermediate syndrome generator and the auxiliary syndrome generator are based upon parity check matrices which are described below in the context of the description of multi-cycle operation. However, it is noted that in the case of both the intermediate syndrome generator and the auxiliary syndrome generator these generators can be made smaller and simpler as a result of the error correction technique described below.

For the purpose of better understanding the present invention, the reader should also appreciate that standard practice in error correction coding involves the generation of what is called the syndrome vector. In the ideal case where there are no errors occurring, the syndrome vector is zero. In fact, in error correction techniques, check bits and/or check symbols are added to the information bits to ensure that the syndrome is in fact zero under ideal (no error) conditions. However, the syndrome vector is nonetheless often readily employable as a mechanism for error correction in the case that errors due occur. Furthermore, the syndrome vector is also employed in error correction techniques as a mechanism for indicating that double errors have occurred. Thus, in general, syndrome generation is employed for indicating the degree of error correction and/or error detection that is possible either at the bit level or at the symbol level.

The present invention with respect to its employment of symbol level error correction and detection and in accordance with its multi-cycle mode of operation is incorporated in a memory system in a memory architectural arrangement in which single bus line failures do not impact the robustness of the coding technique.

Accordingly, it is an object of the present invention to provide improved methods and circuits for error correction and detection in computer memory systems.

It is also another object of the present invention to provide improved single symbol correction and double symbol detection error capabilities in a data processing and in computer memory systems.

It is also an object of the present invention to provide a memory architecture in which single bus line failures do not adversely impact the correctability or detectability of errors in a computer memory system.

It is a still further object of the present invention to provide a process and method for multi-cycle syndrome generation.

It is a still further object of the present invention to provide a multi-cycle error correction and detection process which may be extended to any reasonable number of cycles.

It is a still further object of the present invention to reduce the pin-out requirements for computer memory chips.

It is also an object of the present invention to extend the usability and capabilities of Reed-Solomon codes.

It is also another object of the present invention to provide the capability of using longer codewords in memory and information transmission systems.

It is a still further object of the present invention to provide a simpler method for check bit generation which is particularly useful for longer length codewords.

It is a still further object of the present invention to extend the capabilities of symbol level error technique processes and devices.

It is yet another object of the present invention to keep the overhead associated with symbol level error correction to a small value.

It is yet another object of the present invention to provide error correction codes for long codewords without unduly complicating the circuits needed to provide check bit generation and/or syndrome generation capabilities.

Lastly, but limited hereto, it is an object of the present invention to provide more robust and error-resistant memory and information transmission systems.

The recitation herein of a list of desirable objects which are met by various embodiments of the present invention is not meant to imply or suggest that any or all of these objects are present as essential features, either individually or collectively, in the most general embodiment of the present invention or in any of its more specific embodiments.

DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
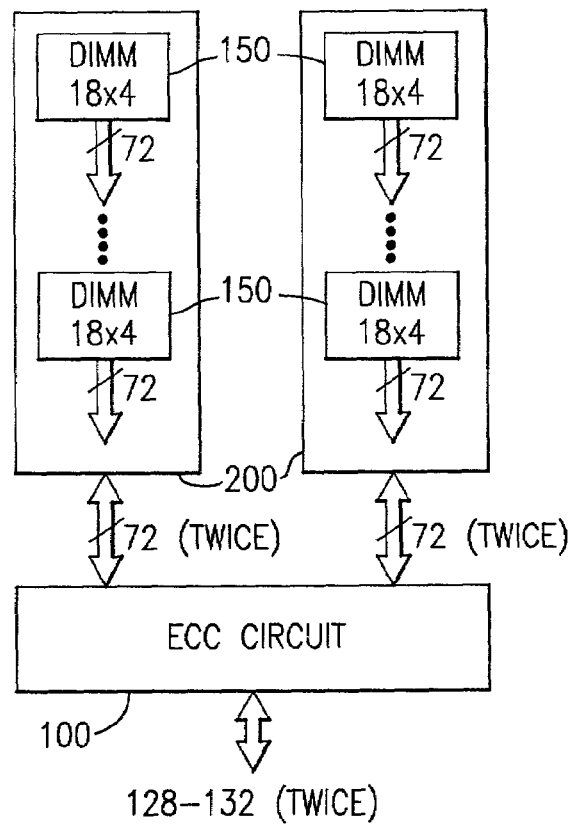
FIG. 1 is a block diagram illustrating a memory architecture at a high level in which the present invention is employed.

Before applying the multi-cycle syndrome features of the present invention to a particular memory design, it is useful to first understand how and why the syndrome is generated in a multi-cycle configuration. In this same vein, once one understands how the multi-cycle generation is developed from the basic theory of Reed-Solomon codes, it is apparent that the circuits of the present invention are described by a pair of matrices which are simpler than those ordinarily applied to Reed-Solomon codes.

Importantly, one of ordinary skill in the art of error correction codes understands that if $\underline{V}$ is a binary vector representing a codeword, then the product of the appropriate ECC parity check matrix and the transpose of the codeword vector $\underline{V}$ is designed to be made up entirely of zero entries, it being understood that the operations of multiplication and addition which are determined by the ones and zeros in the binary check matrix are carried out in the field containing only the elements 0 and 1. In particular, this field is often simply described as GF(2). In this case, the parity check condition is described by Equation 1 below:

$$H \cdot \underline{V}^t = 0 \bmod 2 \quad (1)$$

In general, there are many ways to characterize the parity check matrix H. A particularly useful characterization employs a parity check matrix which is an array of companion matrices. In particular, in accordance with standard coding techniques, if $$p(x) = a_0 + a_1 x + a_2 x^2 + \ldots + a_{m-1} x^{m-1} + x^m \quad (2)$$

is a primitive binary polynomial of degree m and if alpha is a root of p(x) in the finite field $GF(2^m)$, then the companion matrix T associated with the root alpha is an m by m binary matrix T as follows in Equation 3:

$$T = \begin{bmatrix} 0 & 0 & 0 & 0 & \cdots & 0 & a_0 \\ 1 & 0 & 0 & 0 & \cdots & 0 & a_1 \\ 0 & 1 & 0 & 0 & \cdots & 0 & a_2 \\ \cdots & \cdots & \cdots & \cdots & \cdots & \cdots & \cdots \\ \cdots & \cdots & \cdots & \cdots & \cdots & \cdots & \cdots \\ 0 & 0 & 0 & 0 & \cdots & 1 & a_{m-1} \end{bmatrix} \quad (3)$$

In this situation the parity check matrix of a symbol level error correction code with symbol size m is expressed as in Equation 4:

$$H = \begin{bmatrix} T_{11} & T_{12} & \cdots & \cdots & T_{1n} \\ T_{21} & T_{22} & \cdots & \cdots & T_{2n} \\ \cdots & \cdots & \cdots & \cdots & \cdots \\ \cdots & \cdots & \cdots & \cdots & \cdots \\ T_{r1} & T_{r2} & \cdots & \cdots & T_{rn} \end{bmatrix} \quad (4)$$

where $T_y$ is a power of T as described in Equation 3 above. Additionally, n is the number of symbols in the codeword and r is the number of check symbols. The total number of check bits is mr and there are correspondingly nm bits in a codeword. The binary $\underline{V}$ in Equation 1 is expressed in n symbols in the following fashion:

$$\underline{V}=(V_1, V_2, \ldots, V_n),\qquad(5)$$

where each $V_j$ is an m bit binary vector. With this notation, Equation 1 is written:

$$\sum_{j=1}^{n} T_{ij} \cdot V_j^t = 0,\qquad(6)$$

for i=1, 2, . . . r where $V_j^t$ denotes the transpose of the vector $V_j$.

It is also to be noted that the companion matrix T of Equation 3 above can also be expressed as:

$$T=[a, a^2, a^3, \ldots, a^m],\qquad(7)$$

where a is a root of polynomial p(x) is expressed as a column vector of m bits. In general, $T_y$ can be expressed as $T_y=[a_y, a_y^2, a_y^3, \ldots, a_y^m]$ for a finite field element $a_y$ expressed as an m bit vector.

Figure 3:
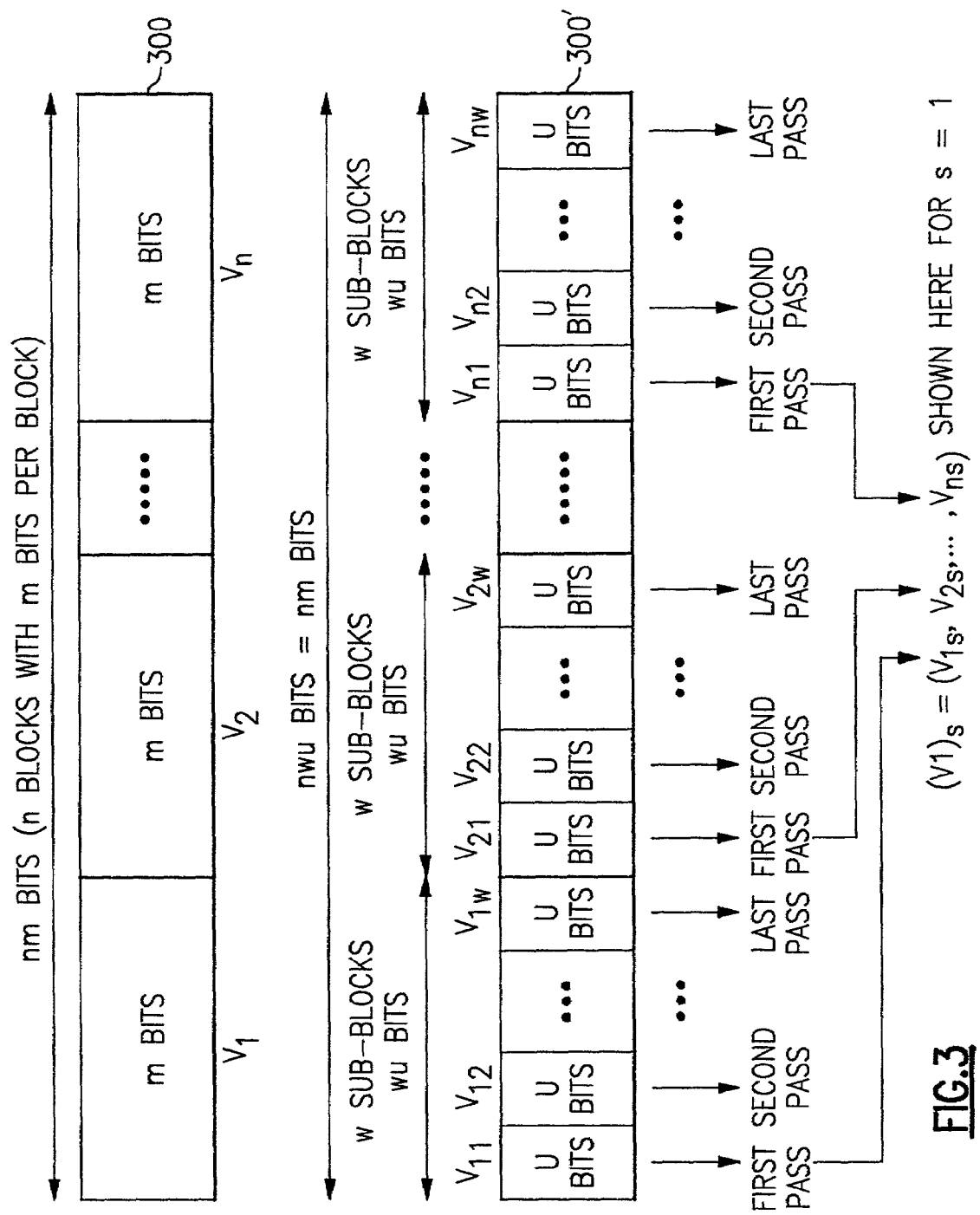
FIG. 3 is a block diagram illustrating the data structure of a codeword which is particularly useful for understanding the multi-cycle structure and data presentation capabilities of the present invention.

Now, in keeping with the multi-cycle structure and architecture of the present invention, it is supposed that m is a composite number so that m can be written as the product of two other integers w and u. Thus, for purposes of the present invention, it is understood that m=wu. It is in this fashion that the symbol bits are broken down into smaller pieces which are more easily processed and protected. Under this assumption, the columns of $T_y$ are grouped into w sets of u columns. Similarly, a symbol $V_j$ of a codeword is grouped into w sets of u bits so that $V_j=(V_{j1}, V_{j2}, \ldots, V_{jw})$, where $V_{js}$ is a u bit vector. A more graphic representation of this partitioning and division is illustrated in FIG. 3. Equation 6 is then written as follows:

$$\sum_{j=1}^{n}\sum_{s=1}^{w} T_{ijs} \cdot V_{js}^t = 0,\qquad(8)$$

where $$T_{ys}=a^{u(s-1)}[a_y, a_y^2, a_y^3, \ldots, a_y^u].\qquad(9)$$

However, with a little rearranging, it is seen that Equation 8 can also be rewritten as follows:

$$\sum_{s=1}^{w} T^{u(s-1)} \sum_{j=1}^{n} (T_{ij1} \cdot V_{js}^t) = 0,\qquad(10)$$

where $$T_{y1}=[a_y, a_y^2, a_y^3, \ldots, a_y^u].\qquad(11)$$

Based upon the above definition of $T_{y1}$, one may conveniently define a matrix H1 which is structured as follows:

$$H1 = \begin{bmatrix} T_{111} & T_{121} & \cdots & \cdots & T_{1n1} \\ T_{211} & T_{221} & \cdots & \cdots & T_{2n1} \\ \cdots & \cdots & \cdots & \cdots & \cdots \\ \cdots & \cdots & \cdots & \cdots & \cdots \\ T_{r11} & T_{r21} & \cdots & \cdots & T_{rm1} \end{bmatrix}.\qquad(12)$$

With this definition for H1, it is seen that Equations 1 and 10 above can now be written as follows:

$$\sum_{s=1}^{w} T^{u(s-1)}(H1)(V1)_s^t = (H1)(V1)_1^t +$$

$$T^u(H1)(V1)_2^t + T^{2u}(H1)(V1)_3^t + \cdots + T^{(w-1)u}(H1)(V1)_w^t\qquad(13)$$

$$=(H1)(V1)_1^t+T^u((H1)(V1)_2^t+T^u((H1)(V1)_3^t+\ldots+T^u((H1)(V1)_w^t)\ldots)),\qquad(14)$$

where $$V1=((V1)_1, (V1)_2, \ldots, (V1)_w)\qquad(15)$$

and $$(V1)_s=(V_{1s}, V_{2s}, \ldots, V_{ns}).\qquad(16)$$

Thus, it is seen that vector V1 is a reordered vector of the original vector $\underline{V}$.

Figure 6:
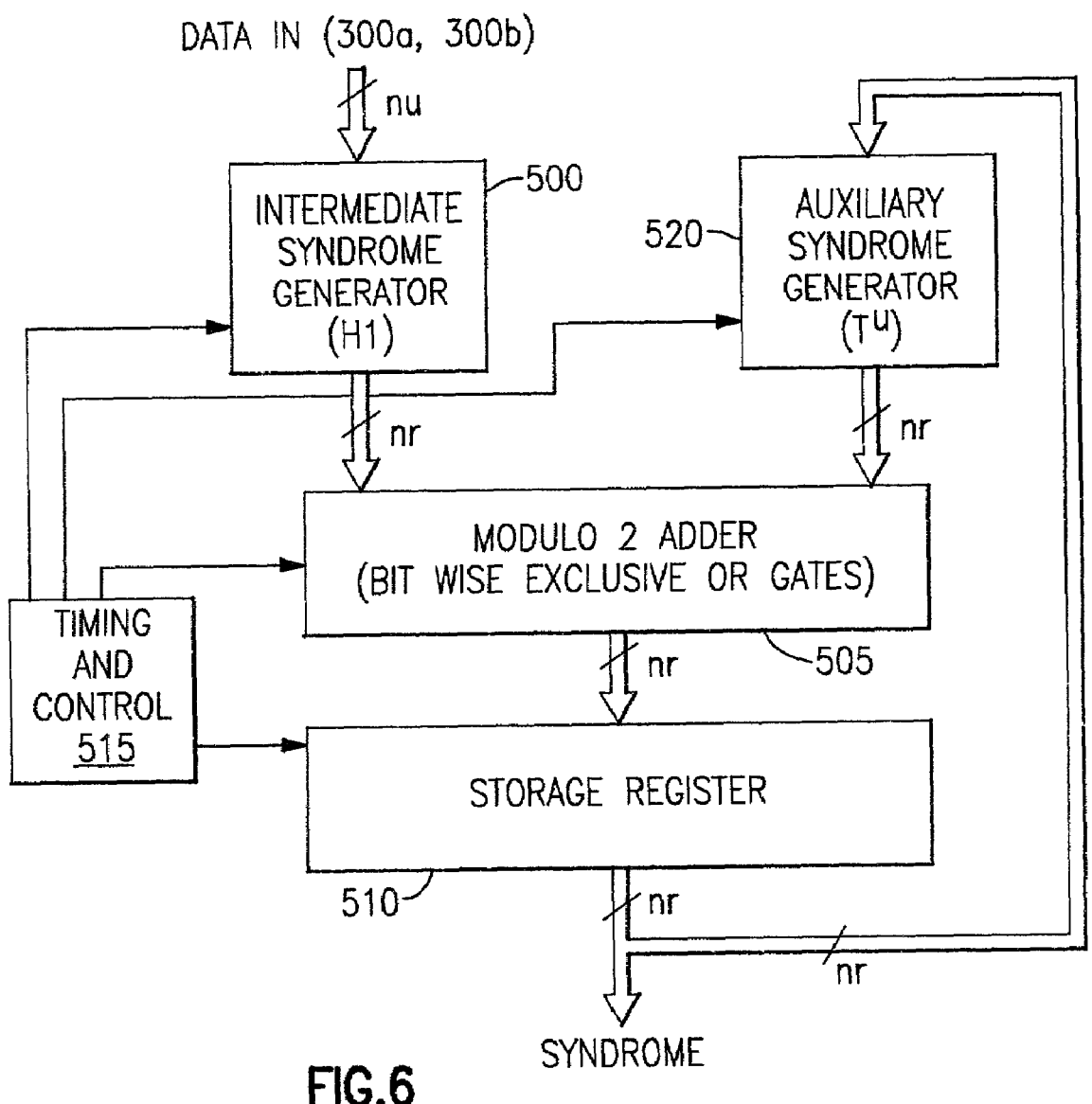
FIG. 6 is a block diagram of an apparatus employed in accordance with the present invention for syndrome generation.

The rewriting of the equation above can perhaps best be understood in terms of a similar rewriting operation carried out on simpler structures such as polynomials of the form $a+bx+cx^2+dx^3$. For purposes polynomial evaluation, such expressions are often written in the form a+x (b+x (c+dx)) where it is seen to be structured as a lot of repetitive operations of addition and multiplication which result in same polynomial upon expansion. This same technique is applied above resulting in the structure shown in the Equation 14. This transformation is extremely useful since it indicates that a syndrome is capable of being generated in accordance with the circuit shown in FIG. 6. In FIG. 6, it is shown that there is a repetitive operation of multiplication which is carried out by the intermediate syndrome generator together with an addition operation. This circuit is discussed in more detail below.

Attention is now focused on an exemplary application of the multi-cycle symbol level error correction technique described above. This technique is now applied in the design and construction of a memory system architecture.

FIG. 1 illustrates one embodiment of the present invention in which the pin-out requirements have been reduced by a factor of one half. Error correction circuit 100 implements the multi-cycle symbol level error correction methods illustrated above. In particular, the system shown in FIG. 1 is constructed with w=2. In particular, memory units 200 employ a plurality of dual inline memory modules (Dimms) 150 each of which is organized in a set of 18 memory chips each of which provides an output of 4 bits. As many Dimm modules 150 are employed as desired to meet memory capacity requirements. It is further noted that each memory unit 200 produces an output of 72 bits. Thus, for the two units shown, there is a pin-out requirement of 144 bits. This is half of the number usually required.

With specific reference to error correction capability, the system shown in FIG. 1 in which error correction circuit 100 incorporates multi-cycle symbol level error correction and detection, the system employs 8 bits per symbol which is a useful number to employ in that it covers all single bus line failures. In this system, 8 bits from the same chip array are accessed and transferred in two cycles, as indicated. Also in this system, an ECC codeword employs 24 check bits and may have up to 288 bits of data together with the check bits. Again, for emphasis, each codeword is transferred in two cycles (w=2).

Figure 2:
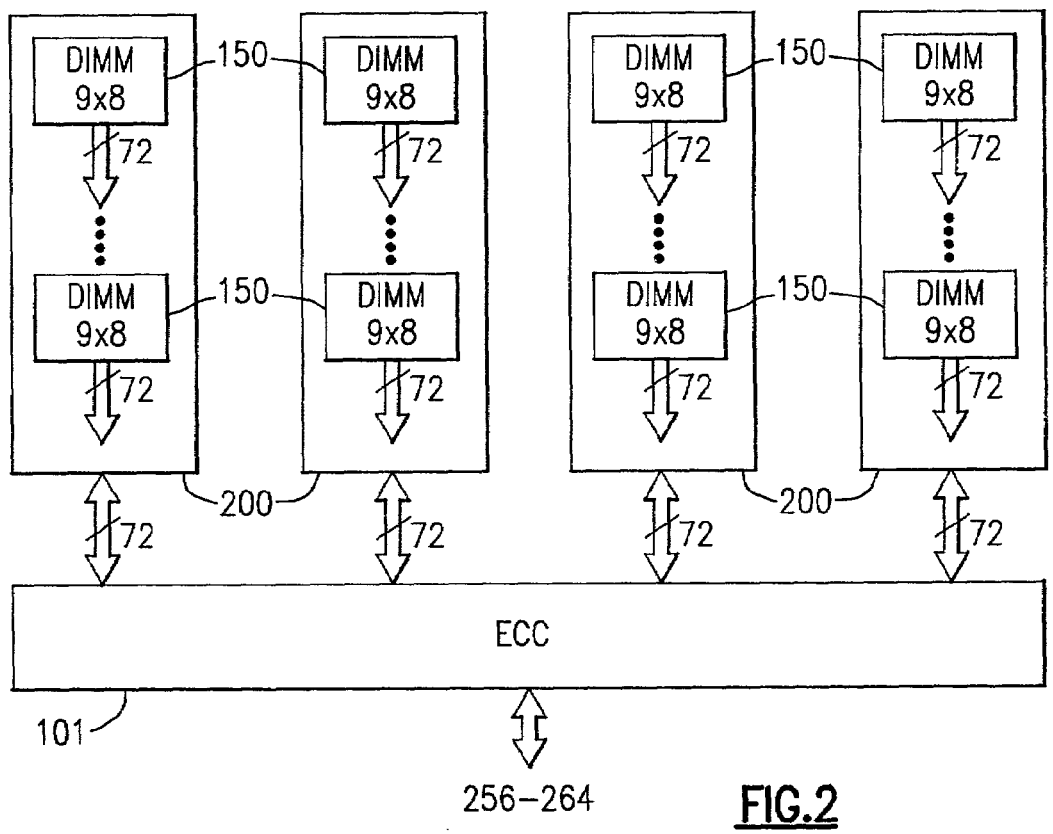
FIG. 2 is a block diagram similar to FIG. 1 but more particularly illustrating the I/O pin-out problem associated with large length codewords.

FIG. 2 illustrates a memory system architecture which does not employ the present invention. In particular, in this case it is seen that, with a codeword which is up to 288 bits in length, the ECC logic circuit requires as many as 264 bits. This represents an extremely great demand on chip I/O (pin-out) requirements. In the circuit shown in FIG. 2, each ECC word has up to 288 bits and is transferred in a single cycle. The single cycle transfer is thus seen to be a limiting problem with respect to pin-out requirements for off-chip ECC operations.

FIG. 3 illustrates a codeword and the ways in which it may be partitioned. For example, codeword 300' is partitioned into n symbols with m bits in each symbol for a total of nm bits. However, for purposes of understanding the preferred implementations of the present invention in terms of multi-cycle symbol error correction, it is best to view codeword vectors as being partitioned as shown in codeword 300'. In particular, in this case, as indicated above, it is assumed that m is a composite number; that is, it is assumed that m can be factored into two integers. In particular, for purposes of present notation, m=wu. Thus, each symbol is partitioned into w blocks with each subblock having u bits, as shown. The notation employed above for the subblocks in codeword 300' follows the nomenclature and symbology employed in the discussion above concerning multi-cycle symbol error correction and detection. This is also true with respect to the description of the reordered vector V1. In the processing that occurs in the circuit shown in FIG. 6, the first pass through what is referred to as the intermediate syndrome generator involves the first u bit subblock from the first symbol plus the first u bit subblock from the second symbol and so on all the way out to the first subblock of the last symbol. Thus, in each cycle, nu bits are passed to the intermediate syndrome generator for processing. These bits are selected from sequential subblocks in different symbol blocks. Codeword 300', as shown in FIG. 3, is illustrative of the general case for multi-cycle symbol error correction processing described above where the processing is carried in w cycles. In a more exemplary embodiment illustrated in FIG. 5, the data reordering structure is based upon a two-cycle or two-pass implementation in which w=2.

Figure 4:
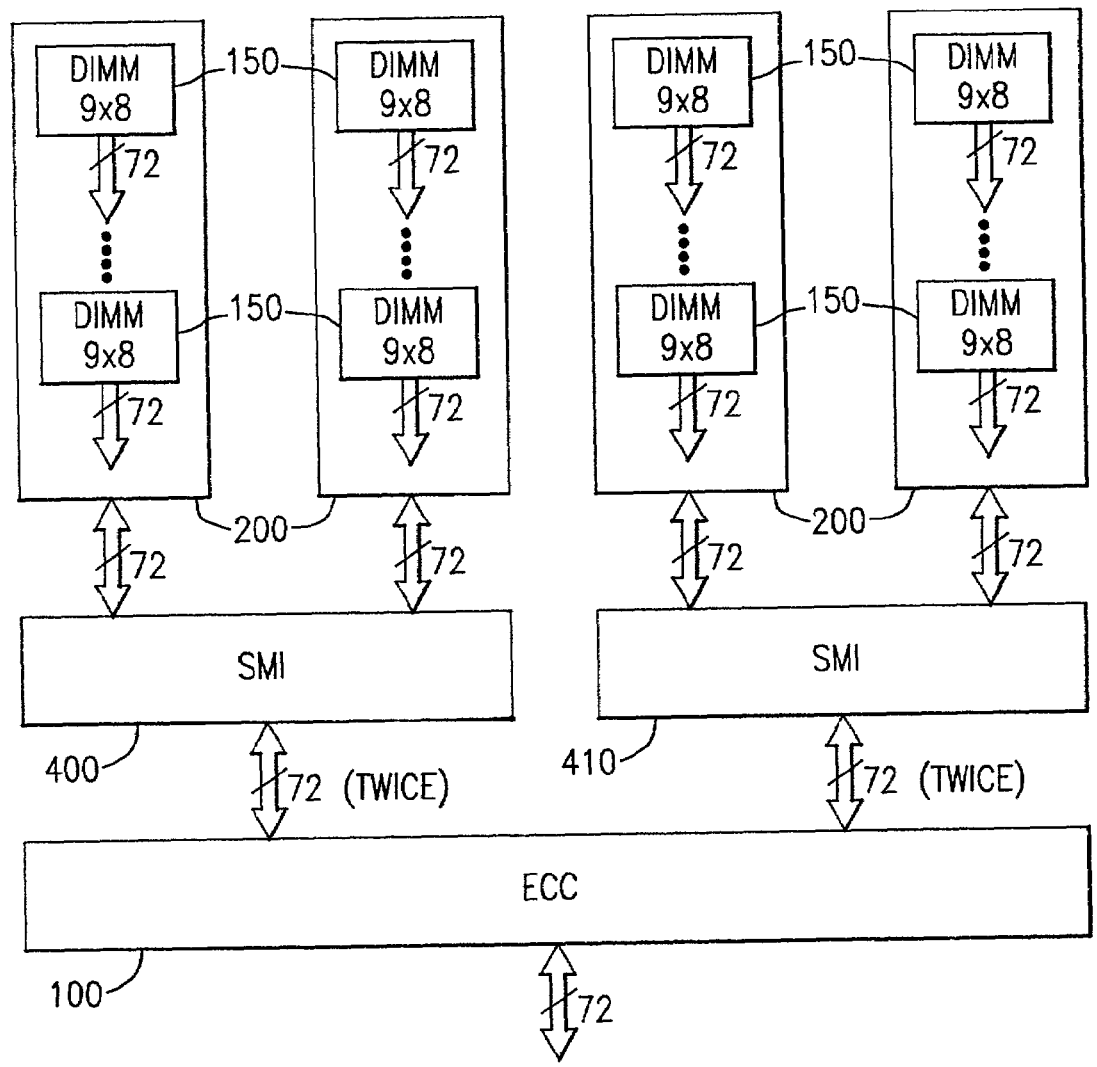
FIG. 4 is a block diagram illustrating a memory architecture which employs the present invention in its most useful form, namely, the combination of multi-cycle symbol capabilities in a correspondingly structured symbol level memory architecture.

FIG. 4 illustrates an embodiment of the invention which improves on that shown in FIG. 2. With essentially the same organization of memory chips as shown in FIG. 2, there are additionally included SMI (Synchronous Memory Interface) circuits which perform buffering and reordering operations consistent with that shown in FIG. 3. Additionally, it is noted that multi-cycle symbol ECC correction circuit 100 is also employed here as it is in FIG. 1. It is the function of these chips and/or circuits to perform buffering and signal line reordering in correspondence with the multi-cycle symbol theory presented above, as expressed in Equation 14. Most relevant in FIG. 4 is the fact that the number of signal lines supplied to ECC circuit 100 is only 144. ECC circuit 100 receives a total of 288 bits in two cycles: 144 bits are passed to ECC circuit 100 in each cycle.

Figure 5:
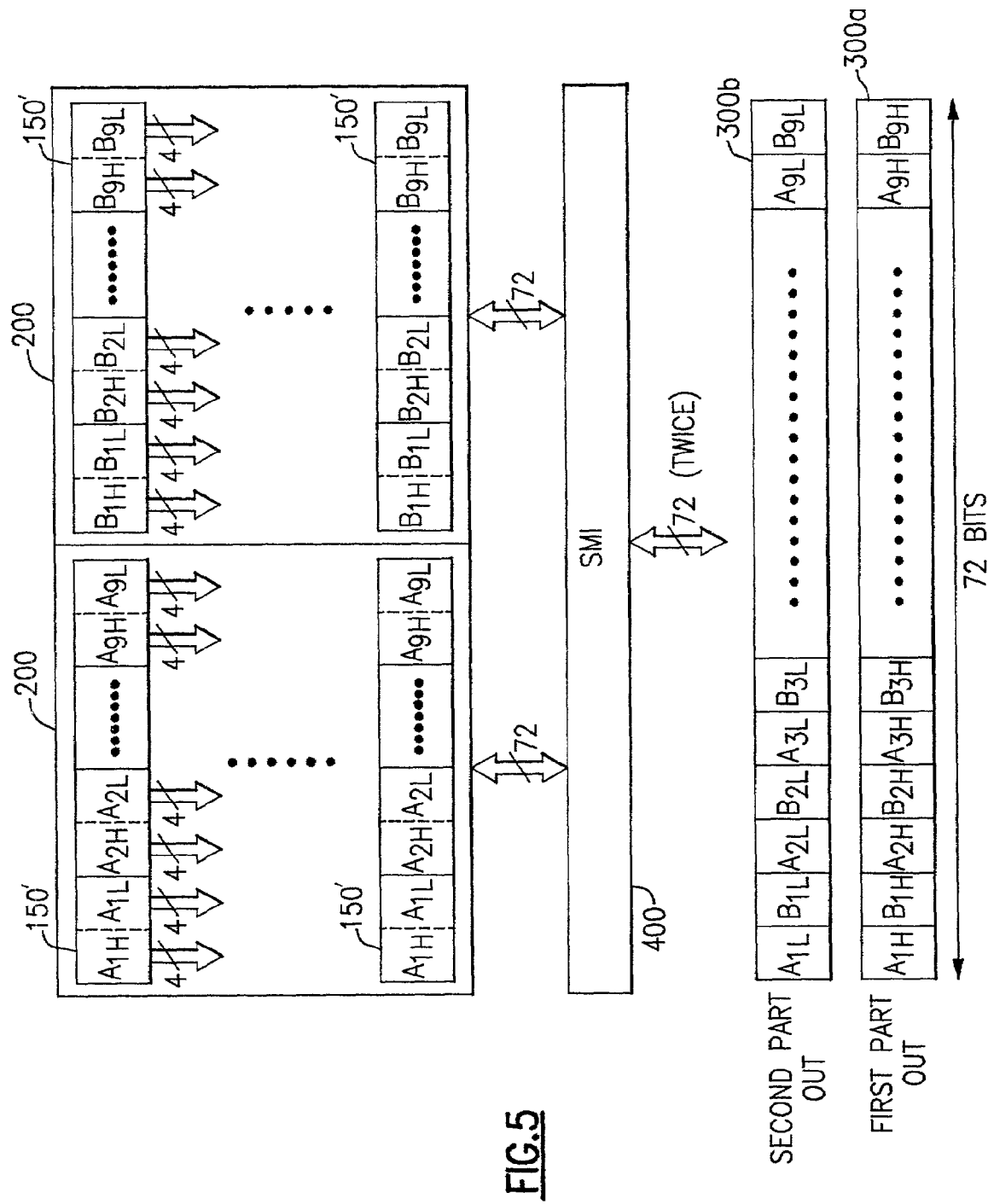
FIG. 5 is a view similar to FIG. 3 but more particularly directed to the specific memory architecture illustrated in FIG. 4.

A better understanding of the order of signals supplied to ECC circuit 100 in FIG. 4 is gleaned from the structure shown in FIG. 5 which represents a more detailed view of either the upper left or upper right-hand portions of FIG. 4. FIG. 5 illustrates an 8 bit-per-chip memory architecture with 9 chips per DIMM. As illustrated in FIG. 5, the high and low order of bits from each chip are each four bits in length and are grouped through the utilization of SMI chip 400 and presented to the ECC circuit in two stages. In a first stage, the bits, as shown by block 300a, are presented. In a second stage, the bits illustrated in block 300b are next presented. In the particular embodiment shown for FIG. 5, there is only a two-cycle (or stage) process (w=2) which suffices for the memory architecture desired using the parameters specified. Accordingly, it is seen that FIG. 5 represents a more detailed illustration of memory system architecture based on a two-cycle symbol level ECC system and, in fact, is a particularization of the more general case shown in FIG. 3.

Next is considered one embodiment of an apparatus for carrying out error correction and detection in accordance with the present invention. In particular, the apparatus is illustrated in FIG. 6. The apparatus illustrated is clearly seen to be a direct implementation of the syndrome generation equation presented by Equation 14. In particular, in the multi-cycle, symbol level error correction techniques of the present invention, it is seen that syndrome generation is accomplished using two relatively small syndrome generators described by parity check matrices H1 and $T^u$. These two syndrome generators operate in normal fashion performing a modulo 2 matrix vector multiplication operation. This is the same operation as illustrated in Equation 1. In particular, syndrome generators 500 and 520, based upon matrices H1 and $T^u$, respectively, typically comprise an array of exclusive-OR gates which perform a bit-wise modulo 2 operation. (In this regard, it is to be particularly noted that these exclusive-OR gates in a circuit such as a syndrome generator are typically arranged in a balanced tree configuration. This circuit arrangement is possible due to the associative nature of the exclusive-OR (modulo 2 addition) operation.) Intermediate syndrome generator 500 is based upon the structure of matrix H1 as described in Equations 11 and 12. Likewise, auxiliary syndrome generator 520 typically and preferably comprises an exclusive-OR gate tree structure based upon the companion matrix T raised to the power $u$, as shown. In particular, intermediate syndrome generator 500 is presented with blocks of nu bits at a time and produces an output of nr bits. These bits are supplied to modulo 2 adder 505 which performs bit-wise exclusive-OR addition on the output of intermediate syndrome generator 500 and on a second adder input supplied from the output of auxiliary syndrome generator 520. Modulo 2 adder 505 accordingly has an output summation which is nr bits wide which is supplied to storage register 510 whose output is, in turn, supplied as an input for the next cycle to auxiliary syndrome generator 520. Timing and control circuit 515 operates to ensure that bits are gated into and out of the syndrome generators and storage register 510 in a cyclical arrangement in order to effectuate parity check Equation 14. Additionally, timing and control circuit 515 also ensures that upon the start of an operation, storage register 510 is cleared (set to zero) so that the corresponding output of auxiliary syndrome generator 520 in the first pass is indeed zero as it should be. After w cycles of operation, the desired syndrome is present in storage register 510. At this point, standard symbol level syndrome treatments are employed in accordance with standard ECC techniques and principles.

The discussion has focused primarily upon symbol level error correction and detection when information is fetched from a memory system. However, the techniques, methods, and systems of the present invention are also applicable to the generation of check bits. In particular, the same circuit shown in FIG. 6 is employed to generate the check symbols which are to be stored along with information symbols. For this operation, it is only necessary that the corresponding check symbol positions be initially filled with zeros. If this is done, the output of the circuit shown in FIG. 6 provides the desired check symbols.

In practice, it is also possible to even further optimize syndrome generation. Once having defined the appropriate matrix Hi, one may employ standard error correction parity check matrix manipulation procedures for reducing the presence of ones in this array since such entries imply a simpler circuit and even perhaps a circuit with exclusive-OR gates arranged in trees of relatively shallower depth (fewer gates between input and output).

Mechanisms for controlling arrays of memory chips to provide multi-cycle operation are readily implemented as part of the function of standard memory controlling chips. Such mechanisms are readily apparent to those skilled in the memory design arts.

From the above, it should be appreciated that all of the stated objects are achieved in one or more embodiments of the present invention. It should also be appreciated that there is provided an error correction and detection mechanism for symbol level codewords which employs multi-cycle syndrome generation capabilities. It should also be appreciated that the present invention provides a memory system in which single bus line failures do not impact the error correction or detection capabilities of the ECC system.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A process for syndrome generation in a binary symbol error correction code in which the parity check matrix is an array of powers of a companion matrix T of a primitive polynomial p(x) of degree m and in which each codeword includes n symbols of which r symbols are redundant check symbols, whereby each codeword thus has nm bits and rn checkbits, said method comprising the steps of:
generating an intermediate syndrome having nr bits for a selected block of nr bits, where m is a composite integer, which is thus the product of non hyphen unit integers u and w;
adding, using modulo 2 addition, said intermediate syndrome to the nr bits from an auxiliary syndrome generator;
storing the result of said addition in an output register;
supplying the output of said register to the input of said auxiliary syndrome generator; and
repeating said steps above w times in sequence over a defined period of time, wherein in each of said w times, a respective one of n sequential blocks of u bit wide data input portions is said selected block of nu bits, to distribute the data flow from the output register to said auxiliary generator over said defined period of time, with said intermediate syndrome generator being characterized using an array of submatrices, there being r rows and n columns of said submatrices with each submatrix having m rows and u columns with those columns corresponding to powers of a root of p(x) in the field $GF(2^m)$, and with said auxiliary syndrome generator being characterized using matrix $T^u$.

2. An apparatus for syndrome generation in a binary symbol error correction code in which the parity check matrix is an array of powers of a companion matrix T of a primitive polynomial p(x) of degree m and in which each codeword includes n symbols of which r symbols are redundant check symbols, wherein each codeword thus has nm bits and rn checkbits, said apparatus comprising:
an intermediate syndrome generator receiving selected blocks of codeword data with each block having nu bits, where m is the product of u and w, and generating an intermediate syndrome vector;
a modulo 2 adder having as a first input the output from said intermediate syndrome generator;
an output register for storing the output from said adder; and
an auxiliary syndrome generator having as its input the contents of said output register and whose output is supplied in w sequential cycles as a second input to said adder;
wherein the intermediate syndrome generator generates a series of intermediate syndrome vectors in sequence over a defined period of time to distribute the data flow from the output register to said auxiliary syndrome generator over said defined period of time;
with said intermediate syndrome generator being characterized using an array of submatrices, there being r rows and n columns of said submatrices with each submatrix having m rows and u columns with those columns corresponding to powers of a root of p(x) in the field $GF(2^m)$, and with said auxiliary syndrome generator being characterized using matrix $T^u$.

3. An apparatus for check bit generation in a binary symbol error correction code in which the parity check matrix is an array of powers of a companion matrix T of a primitive polynomial p(x) of degree m and in which each codeword includes n symbols of which r symbols are redundant check symbols, wherein each codeword thus has nm bits and rn check bits, said apparatus comprising:
an intermediate syndrome generator receiving selected blocks of codeword data with each block having nu bits and with zeros in check symbol positions, where m is the product of u and w, and generating an intermediate vector;
a modulo 2 adder having as a first input the output from said intermediate syndrome generator;
an output register for storing the output from said adder; and
an auxiliary syndrome generator having as its input the contents of said output register and whose output is supplied in w sequential cycles as a second input to said adder;
wherein the intermediate syndrome generator generates a series of intermediate syndrome vectors in sequence over a defined period of time to distribute the data flow from the output register to said auxiliary syndrome generator over said defined period of time;
with said intermediate generator being characterized using an array of submatrices, there being r rows and n columns of said submatrices with each submatrix having m rows and u columns with those columns corresponding to powers of a root of p(x) in the field $GF(2^m)$, and with said auxiliary generator being characterized using matrix $T^u$.

4. An method for check bit generation in a binary symbol error correction code in which the parity check matrix is an array of powers of a companion matrix T of a primitive polynomial p(x) of degree m and in which each codeword includes n symbols of which r symbols are redundant check symbols, wherein each codeword thus has nm bits and rn checkbits, said method comprising the steps of:

provide selected blocks to an intermediate syndrome generator receiving codeword data with each block having nu bits and with zeros in check symbol positions, where m is the product of u and w, and generating an intermediate vector;

as a first input to a modulo 2 adder supplying the output from said intermediate syndrome generator;

storing the output from said adder is an output register; and providing the contents of said output register to an auxiliary syndrome generator whose output is provided over a period of w sequential cycles as a second input to said adder; wherein the intermediate syndrome generator generates a series of intermediate syndrome vectors in sequence over a defined period of time to distribute the data flow from the output register to said auxiliary syndrome generator over said defined period of time;

with said intermediate generator being characterized using an array of submatrices, there being r rows and n columns of said submatrices with each submatrix having m rows and u columns with those columns corresponding to powers of a root of p(x) in the field $GF(2^m)$, and with said auxiliary generator being characterized using matrix $T^u$.

5. A memory for a data processing device, said memory comprising:

an array of memory chips with said chips for transferring u bits at a time;

a multicycle, symbol level error correction and detection circuit receiving a plurality of blocks of nu bits, one block at a time and in sequence, from said array of chips; and means for transferring codewords to said error correction and detection circuit in a plurality, w, of cycles.

6. The memory of claim 5 in which the bits for at least one codeword symbol are transferred in distinct cycles.

7. The memory of claim 5 in which each codeword includes n symbols with m bits per symbol, where m is a composite number, wu.

8. A memory system comprising:

an array of memory chips for transferring only u bits of data at a time;

a multicycle, symbol level error correction and detection circuit receiving a plurality of blocks of nu bits, one block at a time and in sequence, from said array of chips wherein said symbols of said code have m=wu bits per symbol; and means for transferring codeword symbols to said error correction and detection circuit u bits at a time.

* * * * *